US011525554B2

(12) United States Patent
Muster et al.

(10) Patent No.: US 11,525,554 B2
(45) Date of Patent: Dec. 13, 2022

(54) IRRADIATION UNIT COMPRISING A PUMP RADIATION SOURCE AND A CONVERSION ELEMENT

(71) Applicant: OSRAM OLED GmbH, Regensburg (DE)

(72) Inventors: Jasmin Muster, Heidenheim (DE); Dennis Sprenger, Röthenbach a.d. Pegnitz (DE); Joerg Sorg, Regensburg (DE); Sergey Kudaev, Regensburg (DE); Andreas Dobner, Wenzenbach (DE); Melanie Zumkley, Berlin (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/979,605

(22) PCT Filed: Mar. 5, 2019

(86) PCT No.: PCT/EP2019/055411
§ 371 (c)(1),
(2) Date: Sep. 10, 2020

(87) PCT Pub. No.: WO2019/174969
PCT Pub. Date: Sep. 19, 2019

(65) Prior Publication Data
US 2021/0041073 A1    Feb. 11, 2021

(30) Foreign Application Priority Data

Mar. 12, 2018   (DE) ..................... 10 2018 203 694.2

(51) Int. Cl.
*F21V 9/30* (2018.01)
*F21S 41/176* (2018.01)
(Continued)

(52) U.S. Cl.
CPC ............... *F21V 9/30* (2018.02); *F21S 41/16* (2018.01); *F21S 41/176* (2018.01);
(Continued)

(58) Field of Classification Search
CPC ........ F21V 9/30; H01S 5/0087; H01S 5/0237; H01S 5/02345; H01S 5/02212;
(Continued)

(56) References Cited

U.S. PATENT DOCUMENTS

2004/0120155 A1* 6/2004 Suenaga .................. H01L 24/49
362/362
2008/0116473 A1* 5/2008 Sugiyama ............. H01L 33/483
257/E33.07
(Continued)

FOREIGN PATENT DOCUMENTS

CN         207065248 U    *  3/2018
DE    102015115863 A1    *  3/2017    ............ F21V 14/085
(Continued)

OTHER PUBLICATIONS

Translation of JP-2004335507-A; Ishikawa (Year: 2004).*
Translation of CN207065248U; Wang (Year: 2018).*

*Primary Examiner* — Elmito Breval
*Assistant Examiner* — Glenn D Zimmerman
(74) *Attorney, Agent, or Firm* — MH2 Technology Law Group LLP

(57) ABSTRACT

An irradiation unit is disclosed that includes a pump radiation source for emitting pump radiation in the form of a beam, a conversion element for at least partially converting the pump radiation into conversion radiation, and a support on which the conversion element is situated. The support accommodates a through-hole through which the beam including the pump radiation is incident on an incident surface of the conversion element, the though-hole being
(Continued)

laterally delimited by an inner wall face of the support, at least one portion of the face tapering in the direction of the incident surface. During operation, the pump radiation conducted in the beam is at least intermittently at least in part, incident on the inner wall face of the support and is reflected thereby onto the incident surface.

30 Claims, 7 Drawing Sheets

(51) Int. Cl.
F21S 41/16 (2018.01)
H01S 5/0237 (2021.01)
H01S 5/02345 (2021.01)
H01S 5/02212 (2021.01)
H01S 5/024 (2006.01)
H01S 5/323 (2006.01)
H01S 5/00 (2006.01)

(52) U.S. Cl.
CPC .......... H01S 5/0087 (2021.01); H01S 5/0237 (2021.01); H01S 5/02212 (2013.01); H01S 5/02345 (2021.01); H01S 5/02469 (2013.01); H01S 5/32341 (2013.01)

(58) Field of Classification Search
CPC ............ H01S 5/02469; H01S 5/32341; H01S 5/02257; H01S 5/0225; F21S 41/176; F21S 41/16
See application file for complete search history.

(56) References Cited

U.S. PATENT DOCUMENTS

| 2009/0003400 | A1* | 1/2009 | Nagahama | H01L 33/483 372/50.23 |
| 2010/0164346 | A1* | 7/2010 | Li | F21S 10/02 313/46 |
| 2013/0027964 | A1 | 1/2013 | Toyota et al. | |
| 2013/0094216 | A1* | 4/2013 | Sato | F21V 7/28 362/297 |
| 2014/0085923 | A1* | 3/2014 | Nakazato | F21V 13/12 362/558 |
| 2014/0198480 | A1* | 7/2014 | Dai | G02B 5/0205 362/84 |
| 2014/0268787 | A1 | 9/2014 | Nozaki | |
| 2015/0292687 | A1* | 10/2015 | Sugiyama | H01S 5/02212 362/259 |
| 2016/0084451 | A1 | 3/2016 | Annen et al. | |
| 2016/0186936 | A1 | 6/2016 | Kiyota | |
| 2016/0190418 | A1* | 6/2016 | Inomata | H01L 33/502 257/98 |
| 2016/0230939 | A1* | 8/2016 | Van Hout | F21V 23/006 |
| 2017/0373455 | A1 | 12/2017 | Morizumi et al. | |
| 2018/0026421 | A1* | 1/2018 | Seidenfaden | H01S 5/0231 372/25 |
| 2018/0058642 | A1* | 3/2018 | Shibata | F21K 9/64 |
| 2020/0200347 | A1* | 6/2020 | Uwani | H01S 5/32341 |

FOREIGN PATENT DOCUMENTS

| DE | 102016203844 A1 | 9/2017 | |
| JP | 2004335507 A * | 11/2004 | |
| JP | 2014225608 A | 12/2014 | |
| WO | WO-2017115778 A1 * | 7/2017 | ............. F21K 9/64 |
| WO | WO-2018172150 A1 * | 9/2018 | |

* cited by examiner

IRRADIATION UNIT COMPRISING A PUMP RADIATION SOURCE AND A CONVERSION ELEMENT

CROSS-REFERENCE TO RELATED APPLICATIONS

This patent application is a national stage entry from International Application No. PCT/EP2019/055411, filed on Mar. 5, 2019, published as International Publication No. WO 2019/174969 A1 on Sep. 19, 2019, and claims priority under 35 U.S.C. § 119 from German patent application 10 2018 203 694.2, filed Mar. 12, 2018, the entire contents of all of which are incorporated by reference herein.

TECHNICAL FIELD

The present invention relates to an irradiation unit comprising a pump radiation source for the emission of pump radiation and a conversion element for the at least partial conversion thereof into conversion radiation.

BACKGROUND

In irradiation units of the type in question, a conversion element, also referred to as a phosphor element, is irradiated with pump radiation which in the process is converted at least partially into conversion radiation with a different spectral composition. The pump radiation may for example be blue light, and then, in the case of so-called partial conversion, a mixture of partially unconverted blue light together with yellow light as conversion radiation may result in white light. The pump radiation source, typically a laser, and the conversion element are arranged at a distance from one another, with the result that an irradiation device having a high radiance or luminance may be produced.

Such light sources, which are also referred to as a LARP (Laser Activated Remote Phosphor, LARP) arrangement, are used for example in the entertainment sector. Because of the high luminance, typical applications may be in the field of projection or cinematographic projection. Since the luminance is in this case also determined by the size of the region from which the conversion light is emitted, and therefore ultimately by the size of the pump radiation spot, the pump radiation is guided or concentrated by sometimes relatively complex optics or lens systems onto the incidence surface of the conversion element.

SUMMARY OF THE INVENTION

The present invention addresses the technical problem of specifying a particularly advantageous irradiation unit.

This is achieved according to the invention by an irradiation unit as claimed in claim 1. The conversion element thereof is arranged on a carrier, and the pump radiation strikes the incidence surface of the phosphor element through an opening in the carrier. In this case, an inner wall surface of the carrier that bounds the opening toward the side is used in order to reflect a marginal part of the ray beam comprising the pump radiation onto the incidence surface. The inner wall surface of the carrier is thus used to a certain extent for ray beam shaping or concentration of the pump radiation onto the incidence surface. To this end, at least in sections, the inner wall surface is obliquely inclined, i.e. it tapers toward the incidence surface.

In summary, according to the invention, the carrier, which is provided anyway for the mechanical fastening of the conversion element, is simultaneously used in order to shape the pump radiation ray beam or the pump radiation spot on the incidence surface. In comparison with the solution mentioned in the introduction, according to which relatively complex lens systems are provided for the ray beam shaping, this allows a simplified as well as spatially more compact structure to be obtained. Preferably, no lenses at all are provided between the pump radiation source and the carrier (see below in detail), which allows a miniaturized structure. In the ideal case, the pump radiation source and the carrier or the conversion element may then even be housed together, for example in a TO housing (as is used for housing laser diodes).

Preferred configurations can be found in the dependent claims and the entire disclosure, a distinction between device, method and use aspects not always being specifically made in the presentation of the features; in any event, the disclosure is to be interpreted implicitly in respect of all claim categories. If thus, for example, an irradiation unit configured for particular operation is described, this is also to be interpreted as a disclosure in respect of corresponding methods or uses, and vice versa.

The pump radiation source is preferably a laser source, see below in detail. Upstream of the conversion element, the pump radiation may, for example, travel through air as a fluid volume, although in general an inert gas (argon, etc.) or else an evacuated housing may for example also be envisioned. In general, the opening in the carrier, which may for example be conical (see below in detail), could for example also be filled with a transparent material through which the pump radiation can radiate. For example, a metal carrier having a conical opening, into which a complementary transparent cone, for example made of sapphire, is then fitted, could thus be provided. Preferably, however, the opening is a through-hole, i.e. the pump radiation thus radiates therein through the same fluid volume as is upstream of the carrier (i.e. for example air and/or an inert gas or an air mixture having an elevated inert gas content, etc.).

The conversion element may for example comprise a matrix material, for instance a ceramic, glass or else a plastic material, in which the phosphor is arranged distributed over discrete regions, for example embedded in grains of the ceramic or in particle form into the glass or the plastic (in addition, for example, thermal fillers or particles for better thermal dissipation, for instance diamond, silicon, carbide, may also be embedded). In general, however, a conversion element in for example monocrystalline form, for instance a YAG:Ce single crystal, may also be envisioned. Furthermore, the conversion element may for example also be provided consisting of agglomerated phosphor particles, which are applied for example in a suspension, the carrier liquid of which then evaporates. In functional terms, the phosphor forms "conversion centers" in the conversion element, where the pump radiation is converted. It is also conceivable to produce a conversion element in a 3D printing method or an injection-molding method.

3D printing may be advantageous insofar as controlled configuration of the local distributions (phosphor, further fillers, matrix material) may be possible because of the technical degrees of freedom. Beam-limiting elements may also be jointly pressed in (beam confinement), for instance in the case of a phosphor region enclosed by $AlO_2$ structures. A confinement structure may be reflective or, at least in regions, translucent, and it may also have a reflection gradient and/or translucence gradient. The confinement structure may also be formed in several parts.

The term "phosphor" may also refer to a mixture of a plurality of individual phosphors, which for example respectively emit conversion radiation with different spectral properties. Suitable phosphors may for example comprise oxidic or (oxy)nitridic materials, such as garnets, orthosilicates, nitrido(alumo)silicates, nitrido-orthosilicates or halides or halophosphates. Specific examples may comprise doped yttrium aluminum garnets such as YAG:Ce, doped lutetium aluminum garnet such as LuAG:Ce, doped silicon nitride materials such as Eu-doped $CaAlSiN_3$, or the like. Dopants may in general be, for example, Ce, Tb, Eu, Yb, Pr, Tm and/or Sm. Furthermore, additional dopings are also possible, for instance Co dopings.

A conversion element comprising cerium-doped yttrium aluminum garnet (YAG:Ce), in particular comprising YAG:Ce as the only phosphor, may be particularly preferred. With the yellow conversion radiation thereof, in the case of a partial conversion in a mixture with partially unconverted blue pump radiation, white light may then be obtained. Very generally, the conversion is preferably down-conversion, i.e. the conversion radiation has a longer wavelength (lower energy) than the pump radiation.

Irrespective of the phosphor, specifically the conversion element may preferably also comprise scattering centers. These may, for example, be deliberately introduced defects in the matrix material. Scattering may, for example, take place at air pores enclosed in the material (a ceramic may also be correspondingly sintered with a residual porosity by way of which the path length of the light is increased). Scattering particles and air inclusions may cooperate. In the case of a phosphor in glass (highly viscous), porous regions (air inclusions) may also be deliberately introduced, and scattering particles, for instance titanium dioxide particles, may be preferred. If glass is provided as a matrix material, for example, in addition to the phosphor (and optionally the scattering particles), thermally conductive particles, for instance of diamond, sapphire and/or silicon carbide, may for example also be embedded. Of course, the same particles may also fulfil a thermal conduction function as well as a scattering function.

An "incidence surface" is regarded in the present case as that entire side surface of the conversion element which the pump radiation strikes. The conversion element is arranged on the carrier with its incidence surface facing toward the carrier, in other words it is thus fastened on the carrier at or via the incidence surface. The opening in the carrier exposes a subregion of the incidence surface, with the result that the maximum size that the pump radiation spot can have on the incidence surface is inversely established. The pump radiation spot may, but does not have to, fill the entire aperture defined on the incidence surface by the opening in the carrier, see below in detail. The "emission surface" is also the entire side surface of the conversion element from which conversion radiation is emitted only in regions (corresponding to the pump radiation spot). In general, the conversion element is preferably operated in transmission i.e. the incidence and emission surfaces lie opposite one another.

The inner wall surface of the carrier tapers toward the incidence surface, specifically at least in sections. The latter relates to a principal direction of the pump radiation ray beam, along which the pump radiation thus strikes the incidence surface in terms of its centroid. Along this principal direction, there is thus at least one section in which the inner wall surface tapers; it may on the one hand taper over its entire extent, but on the other hand tapering in sections in combination with widening in sections and/or an unchanged, for example cylindrical, extent in sections is also possible. The aforementioned principal direction results from the centroid direction of the ray beam, each direction vector being weighted with its associated radiation intensity during this averaging.

The inner wall surface tapers (at least in sections) toward the incidence surface, and the surfaces enclosed by the inner wall surface in planes perpendicular to the principal direction thus have an area decreasing toward the incidence surface. Even though in general tapering in steps is also conceivable, for example, continuous gradual tapering is preferred. In other words, the areas enclosed by the inner wall surface thus decrease steadily toward the incidence surface. This may, for example, be advantageous in terms of maximally homogeneous or uniform ray beam shaping or adaptation of the pump radiation spot.

The pump radiation is reflected at least partially at the inner wall surface of the carrier onto the incidence surface, i.e. for example in a proportion of at least 5%, 10%, 15% or 20%. Even though variants in which all of the pump radiation is guided by means of the inner wall surface (100%) are also conceivable in general, preferred upper limits may for example be at most 60%, 50% or 40%. Insofar as proportions or ratios of radiation are referred to in the context of the present disclosure, this generally refers to the radiation power.

The pump radiation is intended to be guided by means of the inner wall surface "at least part of the time" during operation—as explained in detail below, and for example there may also be other operating modes in which the pump radiation is not guided by means of the inner wall surface. Preferably, however, there is a static arrangement and the proportion guided by means of the inner wall surface remains unchanged over the course of time.

In one preferred embodiment, the pump radiation ray beam travels without deviation and without refraction from the emission surface of the pump radiation source to the carrier, specifically its opening, i.e. it is then reflected at the carrier for the first time. In other words, no optical elements are arranged between the pump radiation source and the carrier, and the pump radiation ray beam thus in particular does not travel through any lens or any lens system. This is possible because of the use according to the invention of the carrier for ray beam or spot shaping, and particularly compact designs may be achieved (cf. also the comments in the introduction).

In one preferred configuration, the pump radiation source is provided in the form of a semiconductor chip, for example as a III-V semiconductor, for instance InGaN. Even though a surface emitter, also referred to as a VCSEL (Vertical Cavity Surface Emitting Laser, VCSEL) is also conceivable in general, a so-called edge emitter is preferred, see below in detail. The emission surface thereof, which is also referred to as a laser facet, lies on a side edge of the semiconductor chip.

Irrespective of the configuration of the semiconductor chip in detail, it is also preferably housed together with the carrier and the phosphor element, and these components are thus fitted in a common housing. The latter is preferably hermetically sealed so that the pump radiation travels through within a defined gas mixture or a vacuum. The housing may preferably be a metal housing, from which the connection pins are preferably guided away to one side. A so-called TO housing, preferably in a round design, may in particular be provided.

Accordingly, the carrier may preferably be configured to be round as seen looking perpendicularly at the emission surface of the conversion element, also irrespective of the housing shape in detail. This is only one possibility, however, and a rectangular, in particular square, or even hexagonal or octagonal or freely shaped carrier is also possible. In general, the carrier may be adapted to the housing shape and the latter may ultimately be adapted to the application.

In one preferred configuration, a wavelength-dependent mirror, which is reflective for the conversion radiation but transmissive for the pump radiation (in each case at least predominantly), is arranged on the incidence surface of the phosphor element. In any event the majority of the conversion radiation emitted by the conversion element, for example when considering a spectral intensity distribution, is thus reflected, i.e. when considering the integral more than 50%, 60%, 70% or 80%. For reasons of efficiency, perfect reflection (100%) may be preferred, but for technical reasons upper limits may for example be at most 99%, 98% or 95%. This applies analogously for the transmissivity in respect of the pump radiation, even though this preferably has a rather narrow band and the proportion transmitted may therefore be correspondingly higher, for example may be at least 90% or 95% (with theoretical upper limits at 99.9% or 99.5%).

The wavelength-dependent reflective mirror may, for example, be constructed as an interference mirror, also referred to as a "dichroic mirror", i.e. as a multilayer system. It may, for example, be constructed from at least two dielectric materials, for instance $Al_2O_3$ and $SiO_2$, which differ in their refractive indices and follow one another alternately in the multilayer system. Irrespective of the structure in detail, the wavelength-dependent mirror may improve the efficiency, namely by reflecting "forward" conversion radiation that is emitted quasi-omnidirectionally, and therefore also partially "backward" (in the direction of the pump radiation source), in the conversion element.

Preferably, the incidence surface is provided with the wavelength-dependent mirror only in the region of the aperture, i.e. this mirror extends only in the region of the opening but not laterally outside it. In general, unless explicitly indicated otherwise, in the scope of this disclosure specifications such as "toward the side" or "laterally" refer to the directions perpendicular to and extending away from the central axis of the pump radiation ray beam. The central axis of the ray beam lies parallel to the principal direction of the latter, centrally in the ray beam. The only partial mirroring of the incidence surface in the region of the aperture may, for example, be advantageous insofar as that region of the incidence surface which lies laterally outside may then be optimized for the connection toward the carrier, for example may be configured with an AuSn coating for a solder connection. Such a coating outside the aperture may also (additionally) be optimized for reflection and therefore an improvement in efficiency, wherein in this case metallic (wavelength-independent) reflection is preferred.

In one preferred configuration, the pump radiation source, preferably the semiconductor chip, is arranged on a heat sink. The semiconductor chip may in general also be arranged directly on the heat sink, although preferably the semiconductor chip is arranged on a so-called submount and the latter is arranged on the heat sink. The submount may, for example, be provided consisting of AlN or SiC; the heat sink is preferably made from metal, for instance aluminum. The submount may be adhesively bonded or soldered to the heat sink, and the same applies for the mounting of the semiconductor chip on the submount.

Also irrespective thereof in detail, the carrier is preferably connected with a material fit to the heat sink. The latter is then used on the one hand for mounting and cooling the pump radiation source, and at the same time for fastening the carrier relative thereto. Furthermore, connection of the conversion element to the heat sink by means of the carrier may also be advantageous thermally if heat loss falls during the conversion. The carrier may for example be adhesively bonded to the heat sink, although a carrier sintered as ceramic onto the heat sink is also conceivable, the two preferably being soldered to one another.

In one preferred configuration, the conversion element is connected with a material fit to the carrier, even though in general, for example, clamping or bracing would also be conceivable. The conversion element may, for example, be soldered onto the carrier with a metallic solder, although as an alternative, for example, sintering or mounting by means of sintering processes is also conceivable. In general, in this regard it may be advantageous when the processing temperatures can be limited, for which reason a so-called sintering silver paste, nanosilver systems or nanogold systems may in particular be envisioned as connecting materials. In general, adhesive bonding is also conceivable, even though it is less preferred because of the thermal connection.

As already mentioned, the use of an edge emitter is preferred, i.e. the emission surface lies on the side edge of the semiconductor chip. This inversely means that a connecting layer between the rear side of the semiconductor chip and the heat sink, or between the latter and the submount, on the one hand, and a connecting layer between the heat sink and the carrier, or even between the carrier and the conversion element, on the other hand, extend at an angle to one another, and in particular lie at a right angle to one another. This may, for example, also be advantageous in respect of the overall impact structure.

The semiconductor chip may, for example, be electrically connected by means of a rear-side contact, preferably in combination with a front-side connection. The latter is preferably produced by means of one or more bond wires, which then connect the semiconductor chip to a connection pin of the housing. In the case of the rear-side contact, the connection to the connection pin may also be produced with one or more bond wires, which then extends or extend from the heat sink, or preferably the submount, to the connection pin.

Overall, the housing then thus comprises at least two connection pins for the semiconductor chip, and it preferably also comprises one or two further connection pins for contacting a safety device. With this safety device, the mechanical integrity or the presence of the conversion element may be monitored, to which end the conversion element is preferably provided with a corresponding conductive track or conductive track structure. The latter may be metallic or, for example, provided consisting of indium tin oxide (ITO). If fracture or tearing of the conversion element takes place, in general the conductive track is also damaged, which may be detected by measurement techniques.

Such a safety device may, for example, be advantageous insofar as, in the event of a corresponding detection or fault, the pump radiation source may then be dimmed or fully turned off. Otherwise, specifically, in the event of a torn/fractured conversion element, or one which has fallen off, the unconverted pump radiation could propagate to the illumination application, which may entail a significant photobiological risk for an observer there, and specifically may lead to damage of the retina and in the worst case to vision loss. Although in the case of partial conversion some unconverted pump radiation does reach the illumination application even in normal operation, it is generally scattered, i.e. spread out, in the conversion element (the radiance is lower). The monitoring of the conversion element may, for example, be carried out resistively and/or inductively, or else capacitively, the former being preferred.

In general, sintering processes may also in turn be envisioned in respect of the material-fit connection between the heat sink and the carrier, that is to say for example a sintering silver paste, nanosilver systems or else nanogold systems may be employed. A eutectic soldering process is however preferred, see below in detail.

In one preferred configuration, both the heat sink and the carrier, and the carrier and the phosphor element, are connected to one another by means of a solder, at least one of the solders being a eutectic solder. The eutectic solder may, for example, be an AuSn solder which may be present either in the form of a thin pressed material platelet (also referred to as a preform) or in the form of a previously applied solder deposit. Irrespective thereof in detail, the use of a eutectic solder may be particularly advantageous in the present case because its melting point increases when the solder is cooled again after the soldering. Since there are at least two solder connections, namely between the heat sink and the carrier as well as between the carrier and the conversion element, and these connections are preferably produced in succession for practical reasons, the melting temperature increased after the first soldering process may prevent floating of the solder or of the connection in the subsequent soldering process.

The soldering is generally carried out in general by a so-called reflow process, during which the components to be connected to one another are collectively brought to the relevant temperature, for example in an oven. Preferably, the conversion element is initially soldered to the carrier and the carrier is subsequently soldered to the heat sink. Preferably, a eutectic solder, which has an increased melting temperature after cooling, is also used in the second soldering process. Specifically, during the further processing to form a hermetically sealed overall module too, in particular the encasing with a metal housing, further process steps that in turn entail application of heat may subsequently be necessary.

Irrespective thereof in detail, if the carrier is soldered to the heat sink, the pump radiation source may also preferably already be mounted on the latter, preferably by means of a eutectic solder. Moreover, reference is also made to the method features specified below, the use of a eutectic solder in general not being compulsory, but rather a solder with a higher melting temperature may for example also be selected for the first soldering step than for the subsequent soldering step.

In one preferred embodiment, the inner wall surface of the carrier, which bounds the cutout of the carrier toward the side, is mirrored. In other words, a mirror layer, for example a metallic mirror layer, for instance made of (highly pure) silver, thus forms the inner wall surface. In general, the carrier may generally for example also be inherently reflective, in any event to a certain extent, for instance in the case of a metal carrier. As an alternative, the carrier may for example be provided consisting of AlN or SiC.

In one preferred embodiment, the inner wall surface of the carrier is rotationally symmetrical. Preferably, the rotation axis of this rotational symmetry lies parallel to the central axis of the pump radiation ray beam, and particularly preferably the two axes coincide.

In one preferred configuration, the tapering inner wall surface respectively has a rectilinear profile as seen in sectional planes that respectively contain the central axis of the pump radiation ray beam. Even though in general a slightly concavely or convexly curved profile is for example also conceivable, this rectilinear extent is preferred. In combination with the rotational symmetry, the tapering inner wall surface then thus has a truncated-conical or frustoconical shape. In respect of a definition of the "central axis", reference is made to the indications above.

In one preferred embodiment, the tapering inner wall surface encloses, at its end proximal (close to the conversion element, a surface which is at least 20%, more and particularly preferably at least 25% or 30%, smaller than a surface enclosed by the tapering inner wall surface at its end distal to (remote from) the conversion element. Possible upper limits may (irrespective of the lower limits) for example be at most 80%, 70% or 60%. The surface, which preferably may respectively be circular, enclosed by the inner wall surface in a respective plane perpendicular to the central axis of the ray beam is considered in each case.

The tapering inner wall surface may for example also have a curved, for instance parabolic, profile, that is to say in the case of preferred rotational symmetry it may describe a paraboloid shape. A freely shaped surface may also be envisioned.

In one preferred embodiment, the inner wall surface tapers only in one section, and the latter is followed by a further section in which the inner wall surface then widens in the direction toward the conversion element. This further section is closer to the conversion element, that is to say in the direction of the incidence surface the inner wall surface initially tapers then widens. As seen in sectional planes that contain the central axis of the ray beam, to a certain extent a cutout or a cavity on the incidence surface is provided with the further section. In the region of this cutout, radiation emitted or reflected at the incidence surface of the conversion element may advantageously be reflected back to the conversion element (i.e. be recycled), which may offer an efficiency advantage.

Radiation unintentionally emitted "backward" is thus guided "forward" again, and therefore at least with a certain probability is converted or emitted as conversion radiation at the emission surface. The radiation unintentionally emitted "backward" may, for example, be pump radiation partially reflected at the incidence surface (Fresnel reflections), although it may also partially be conversion radiation emitted backward (even in the case of wavelength-dependent mirroring of the incidence surface, when it is very broadband and therefore unfavorable in respect of the band edge). Particularly in this section with the cutout, the inner wall surface is preferably mirrored highly reflectively (for example metallically, for instance with silver), and it is preferably mirrored entirely (see above).

In one preferred configuration, as seen in sectional planes that respectively contain the central axis of the ray beam, the widening inner wall surface respectively has a concavely curved profile. The recess is thus to a certain extent configured with a trough shape. Preferably, in the aforementioned sectional planes there may be a profile that is circular (in sections), that is to say the inner wall surface may in particular have a spherical shape in the region of the cutout (in the case of the preferred rotational symmetry, see above). The concave, in particular circular or spherical configuration may be advantageous in respect of the recycling efficiency, or it may also concentrate the recycled radiation onto the incidence surface. In detail, a suitable size of the cutout may be produced in the course of optimization as a function of the rest of the geometry, for instance with a ray-tracing simulation, in which case furthermore the dimensions of the ray beam or the scattering and conversion properties of the conversion element may also be taken into account.

In preferred embodiments, which are likewise aimed at an efficiency improvement, the incidence surface is provided with input coupling elements for increasing the input coupling efficiency and/or the emission surface is provided with output coupling elements for increasing the output coupling efficiency. The coupling elements may, for example, be present in the form of a structured, i.e. rough or roughened surface. Corresponding structuring on the incidence and/or emission surface may, for example, be obtained from a corrugated surface, in which case the structures—per se and with respect to one another—may be constructed symmetrically or else asymmetrically. Periodic patterns may be discernible, but entirely randomly distributed (chaotic) sequences are also similarly possible. The structures may, taken perpendicularly to the respective surface, have the same height and/or the same edge steepness as one another, but this is not compulsory. Grooves or beads respectively extending two-dimensionally over the surface are possible, but similarly so are discrete individual structures. Of course, combinations of the aforementioned variants are also possible.

A coating of nanoparticles may also form the coupling elements, with the result that ideally a homogenizing effect (mixing of the radiation) may be achieved at the same time. The nanoparticles may, for example, be provided consisting of $SiO_2$, $TiO_2$, $Al_2O_3$, $ZnO_2$, $ZrO_2$ and/or $Y_2O_3$, and mixed oxides are also expressly possible, likewise mixtures of different particles. As an alternative or in addition to the oxides mentioned, the nanoparticles may for example also be composed of one or more phosphors. The above-mentioned structuring and the nanoparticles may be provided as alternatives or in combination with one another. In the case of a combination, a structured subregion and a subregion provided with nanoparticles may be mutually disjoint, but they may likewise have an overlap, a stepped or even gradual transition being possible; full overlap is also possible.

Irrespective of the way in which the input and output coupling elements are constructed in detail, they increase the efficiency. In the case of the input coupling structures, more pump radiation thus enters the conversion element than without the input coupling structures; in the case of the output coupling structures, more conversion radiation (for example partially unconverted pump radiation) emerges from the conversion element than without the output coupling structures. The input and output coupling elements may on the one hand, cover the respective surface fully, but only partial coverage is similarly also possible.

The possibilities described below in relation to the arrangement or structuring of the coupling elements in the case of only partial surface coverage are intended to be disclosed both in respect of the structured surface and in relation to the nanoparticles. A subregion, covered with the coupling elements, of the incidence and/or emission surface may, for example, be coherent in itself or alternatively subdivided into a plurality of discrete individual subregions. A circularly, in particular rotationally symmetrical geometry or arrangement, but on the other hand also an entirely asymmetrical arrangement, are possible. The arrangement of the coupling elements may, in particular, also be used for the shaping or adaptation of the conversion radiation on the exit side.

Irrespective of whether it is coherent or subdivided into individual subregions, the coupling factor may also vary over the surface. A stepped transition is possible in this case, but a gradual profile may similarly also be employed. The difference may result from at least one parameter (for example the size of the structure or of the nanoparticles, or their composition, etc.), but it is similarly possible for a plurality of parameters to also be varied over the surface.

If the coupling elements are distributed over a plurality of discrete individual subregions, these may have the same size or else a different size. They may respectively be symmetrical or else asymmetrical per se and/or with respect to one another, and they may likewise differ in coupling factor.

In one preferred embodiment, the pump radiation ray beam has a different aperture angle upstream of the carrier on two different, mutually perpendicular axes. Preferably, the pump radiation is emitted by an edge emitter, i.e. at the side edge of a semiconductor chip (see above), and the different aperture angles are obtained as a result thereof. The axis with the larger aperture angle is generally perpendicular to the layer stack of the semiconductor chip, and is referred to as the fast axis; the axis with the smaller aperture angle is referred to as the slow axis. This results generally from a laser facet that has a much smaller extent in the direction of the layer stack (thickness direction of the semiconductor chip) than in the surface, i.e. along the edge. A typical laser facet may, for example, have a size of 1 µm×30 µm.

Insofar as aperture angles are considered in general in the scope of this disclosure, this refers to the extent of the respective ray beam according to the full width at half maximum (FWHM; as an alternative, for example, a decrease to $1/e^2$ could also be considered). Insofar as, for example, the size of the pump radiation spot on the incidence surface or of a conversion radiation spot on the emission surface is considered, its respective size is measured according to the full width at half maximum of the corresponding irradiation distribution. As a result of the different aperture angles upstream of the carrier, the pump radiation ray beam has a greater extent, as seen in a sectional plane perpendicular to its central axis, along a first principal axis than along a second principal axis perpendicular thereto. As seen in the aforementioned section, the pump radiation ray beam may, in particular, have an elliptical shape.

In one preferred embodiment, which relates to the pump radiation ray beam with different aperture angles, the pump radiation spot produced on the incidence surface is at least less distorted than the pump radiation ray beam upstream of the carrier. In other words, the distortion is counteracted by the (partial) reflection of the pump radiation at the inner wall surface, which reflects the use of the carrier for the ray beam shaping.

In general, a certain compensation could, for example, also be achieved with a cylindrical lens, although with a view to a compact design, the pump radiation preferably does not pass through any optical element upstream of the carrier, however, see above.

Specifically, the lower distortion on the incidence surface is manifested when the principal axes, along which the pump radiation ray beam has the different extent in the sectional plane upstream of the carrier, are imaged onto the incidence surface. The extent of the pump radiation spot is then taken along these axes that are virtually imaged onto the incidence surface. Insofar as the extents along the two axes still differ, the difference should be at least less than in the preceding sectional plane, for example by at least 50%, 60% or 70%. Particularly preferably, the pump radiation spot may have the same extent along the two axes, but on the other hand there may also still be a small deviation (so that possible upper limits of the reduction may, for example, be at most 90% or 80%).

In one preferred embodiment, the pump radiation source is mounted so that it can be offset. To this end, the pump radiation source may for example be mounted on a piezo element, which may be advantageous with a view to the compact structure overall. In general, however, a miniaturized linear bearing, etc., is of course also conceivable. In general, the offsettable mounting is preferably jointly integrated into the housing.

Irrespective thereof in detail, the pump radiation source may occupy different positions relative to the carrier in the offsettable mounting, i.e. these positions differ in different operating modes. In at least one of the operating modes, the pump radiation is guided at least partially by means of the inner wall surface of the carrier (this means "at least part of the time"). With the offsetting of the pump radiation source, the position and/or shape of the pump radiation spot on the incidence surface may be modified, which may advantageously be used for shaping the conversion radiation spot. At least preshaping of the radiation distribution or light distribution in the far field is possible (or as an alternative also in combination with downstream optics). In this case, operating modes in which no pump radiation strikes the inner wall surface, i.e. all of the pump radiation passes through the opening in the carrier without reflection to the incidence surface, may also be envisioned.

In one preferred configuration, the pump radiation source can be offset toward the side. An offset direction is thus at least at an angle to the central axis of the pump radiation ray beam (partial offset toward the side and toward or away from the conversion element), preferably perpendicularly thereto (lateral offset only). In general, however, at least the size of the pump radiation spot may also vary with an offset toward or away from the conversion element.

In one preferred embodiment, the irradiation unit comprises a reflector, at the reflection surface of which at least a part of the conversion radiation emitted at the emission surface of the conversion element is reflected. In the case of the preferred partial conversion, the partially unconverted pump radiation is then preferably also reflected, a metallic (not wavelength-dependent) reflector being preferred. With the downstream reflector, in cooperation with the beam shaping upstream of the conversion element, in particular the distribution in the far field may be set or at least preset (at the module level or headlamp level, there may be further optical elements downstream of the reflector).

In one preferred configuration, the reflection surface of the reflector is concavely curved at least in regions, preferably entirely. The reflection surface may for example have a paraboloid shape, for instance in order to collimate the radiation emitted at the emission surface; on the other hand, for example, concentration may be achieved with an ellipsoidal reflection surface. In general, the reflection surface is preferably provided in such a way that the radiation emitted at the emission surface and reflected at the reflection surface does not strike the conversion element again, but travels past it, or propagates away from it.

In one preferred configuration, the reflection surface has a focal point, and it may for example be provided in paraboloid or ellipsoidal form (see above). Preferably, the reflector is then arranged in such a way that this focal point lies in a conversion radiation spot on the emission surface of the conversion element. Particularly preferably, the focal point lies centrally in the conversion radiation spot.

In one preferred embodiment, the reflector is fastened at least indirectly on the carrier. In general, however, a reflector provided integrally, i.e. monolithically consisting of the same continuous material, with the carrier could for example also be envisioned. Preferably, the two are fastened on one another at least indirectly (for example by means of the housing), preferably directly (except, for example, for an assembly connecting layer, etc.).

In one preferred configuration, the reflector is connected with a material fit to the carrier, reference being made to the indications above relating to "material fit", etc. The two may, for example, be adhesively bonded or soldered to one another, sintering also being possible.

The invention also relates to a method for producing an irradiation unit as discussed in the present document, wherein the conversion element is arranged, preferably fastened with a material fit, on the carrier. In respect of further method details, reference is explicitly made to the disclosure above.

In one preferred embodiment, the heat sink and the carrier are soldered to one another in one soldering step, and the conversion element and the carrier are soldered to one another in another soldering step, these soldering steps being carried out sequentially. In this case, the solder soldered first is preferably selected in such a way that in any event it has a higher melting point during the subsequent soldering step than the solder soldered in this subsequent soldering step. It is possible that the higher melting point is not obtained until during the cooling after the first soldering step (eutectic solder, cf. the comments above), but on the other hand it is also possible to select solders having melting temperatures that are initially different. For example, SnAgCu has a lower melting temperature than AuSn (the latter is then soldered in the first soldering step).

The invention also relates to the use of an irradiation unit as disclosed in the present document for illumination. In general, for example, applications in the field of entertainment illumination or building illumination, including architainment, may also be envisioned, and furthermore industrial or other types of working surfaces may also be illuminated, applications also being possible in the field of horticulture. An application in the field of illumination, in particular exterior illumination, of vehicles, and in general for example also aircraft or watercraft (airplanes, helicopters, ships), is preferred. An application in the field of the exterior illumination of motor vehicles, for instance motorcycles, but also in particular trucks and automobiles, is particularly preferred, and use in headlamps, in particular a front headlamp of a motor vehicle, may be particularly preferred.

In the motor vehicle sector, the irradiation unit may for example be used for a high beam or auxiliary high beam, i.e. in any event for high beam assistance. It is, however, also possible for example to produce a daytime running light function or a low beam or front fog light, this also being by virtue of a defined high beam distribution that may be obtained from the measures explained above in detail. The irradiation unit is preferably integrated in a front headlamp, in which, for example, a turn indicator and the like may then also be fitted.

For a daytime running light, for example, a plurality of irradiation units may also be combined (see below) in order to increase the overall size of the light-emitting surface, for instance to at least 25 cm$^2$. Because of the compact overall size of the individual irradiation unit, this may still be achieved with a structure which is spatially optimized overall.

For a low beam, about 1000 lm may for example be required, which may for example also be achieved by combining a plurality of irradiation units (at least two, for example even three for a more homogeneous or more uniform light distribution).

In one preferred configuration, a plurality of irradiation units are integrated together to form a module, that is to say for example arranged at a relative distance from one another of less than 10 cm, 5 cm or 2 cm (possible lower limits may, for technical reasons, for example be at least 0.1 cm or 0.5 cm). That is to say, for example, at least two, for example precisely two or even three, irradiation units are combined. The combination of a multiplicity of irradiation units (at least three) may advantageously also make it possible to construct a module for adaptive road lighting; the light emitted by the individual irradiation unit is specified in the respective spatial direction, and by switching the individual irradiation units on and off the spatial directions supplied with light overall may be set and the light distribution in the far field may therefore be adapted.

BRIEF DESCRIPTION OF THE DRAWINGS

The invention will be explained in more detail below with the aid of exemplary embodiments; the individual features in the scope of the co-ordinate claims may also be essential to the invention in a different combination, and furthermore a distinction is also not made in detail between the different claim categories.

In detail.

PREFERRED EMBODIMENT OF THE INVENTION

Figure 1:
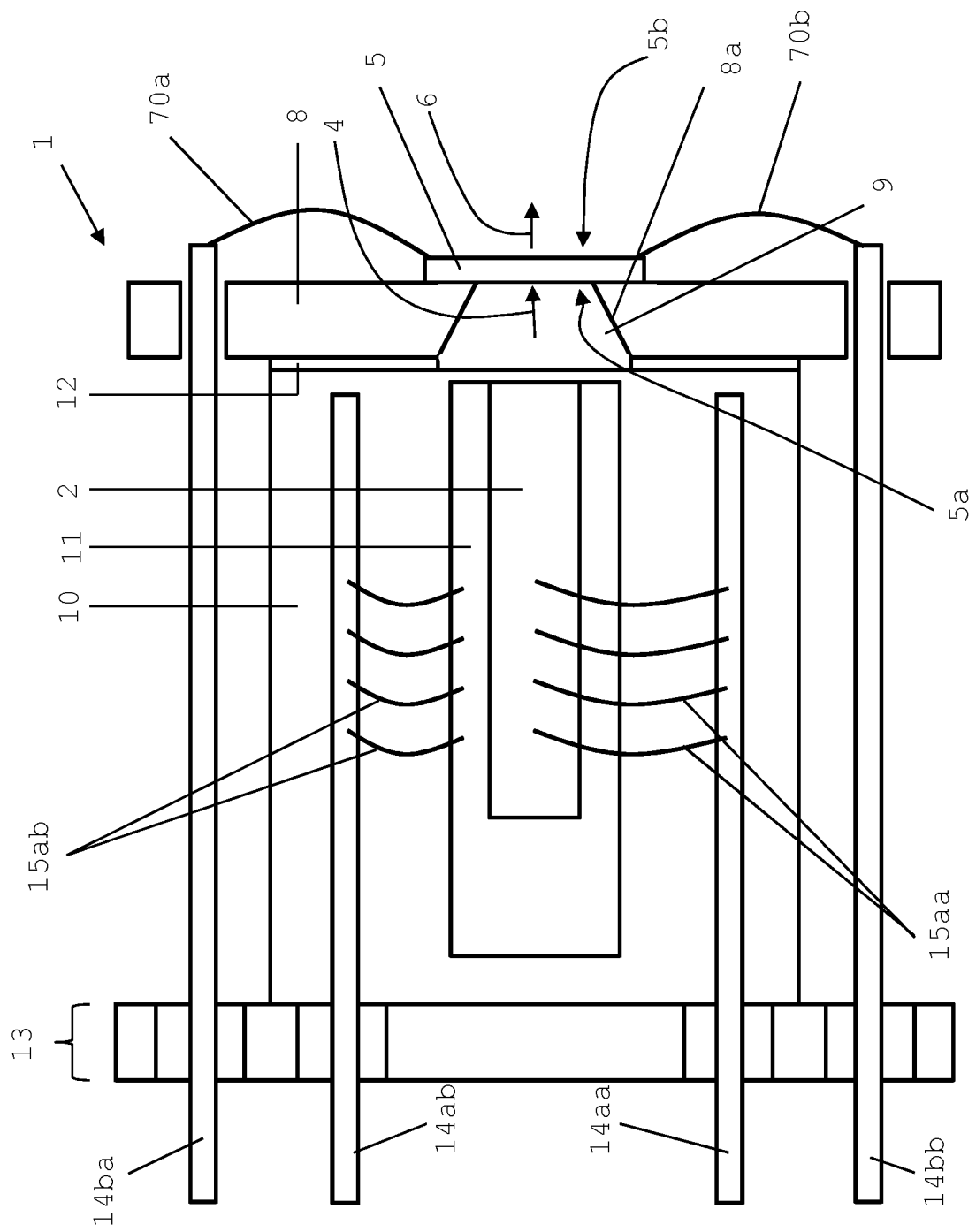
FIG. 1 shows an irradiation unit according to the invention in a schematic representation, specifically for illustration in the state without a complete housing.

FIG. 1 shows an irradiation unit 1 according to the invention in a schematic representation, in a partially sectional side view. The irradiation unit 1 comprises a pump radiation source 2 for emitting a ray beam 3 comprising pump radiation 4. The pump radiation source 2 is a semiconductor chip, specifically an edge emitter. The pump radiation 4 emitted thereby in the form of the ray beam 3 is predominantly blue laser light.

The irradiation unit 1 furthermore comprises a conversion element 5, in the present case comprising a yellow-converting phosphor, namely yttrium aluminum garnet (YAG:Ce). The pump radiation 4 is partially converted by this phosphor into conversion radiation 6, in the present case into yellow light. The pump radiation 4 is in this case only partly converted, i.e. a proportion of unconverted blue light remains downstream of the conversion element 5, which then gives white light when mixed with the yellow conversion light. In addition to FIG. 1, in the following presentation reference is also made to FIG. 2, which shows an enlarged detail view (for which reason some of the reference signs mentioned below are denoted only in FIG. 2, but not in FIG. 1).

The conversion element 5 is operated in transmission. There are thus an incidence surface 5a, which the pump radiation 4 strikes, and an emission surface 5b, at which the conversion radiation 6 is emitted, opposite one another. In order to increase efficiency, a wavelength-dependent mirror 7, which is transmissive for the pump radiation 4 but reflective for the conversion radiation 6 (in principle emitted omnidirectionally in the conversion element 5) is arranged on the incidence surface 5a.

The conversion element 5 is arranged on a carrier 8, which in the present case is provided consisting of silicon carbide (SiC) (cf. the introduction to the description in relation to possible alternatives). One particular feature resides in the geometrical configuration of the carrier 8, which is configured with an opening 9. This forms an aperture, and the conversion element 5 is thus arranged flush therewith. An inner wall surface 8a of the carrier bounds the cutout 9 toward the side. This inner wall surface 8a tapers toward the conversion element 5.

The carrier 8 is mirrored on the inner wall surface 8a, in the present case with a silver layer that forms the inner wall surface 8a, but it is not represented in detail for the sake of clarity. The function is shown in particular by the detail view according to FIG. 7. The ray beam 3 comprising the pump radiation 4 propagates divergently away from an emission surface 2a of the pump radiation source 2 toward the conversion element 5. In order to produce a design which is compact overall, in the present case no lens or no lens system is provided for ray beam shaping. In order to guide the ray beam 3 comprising the pump radiation as much as possible onto the incidence surface 5a of the conversion element 5 despite this, pump radiation 4 is partially reflected at the inner wall surface 8a of the carrier 8. The carrier provided for mechanical fastening of the conversion element 5 is thus advantageously additionally used for ray beam shaping.

Figure 2:
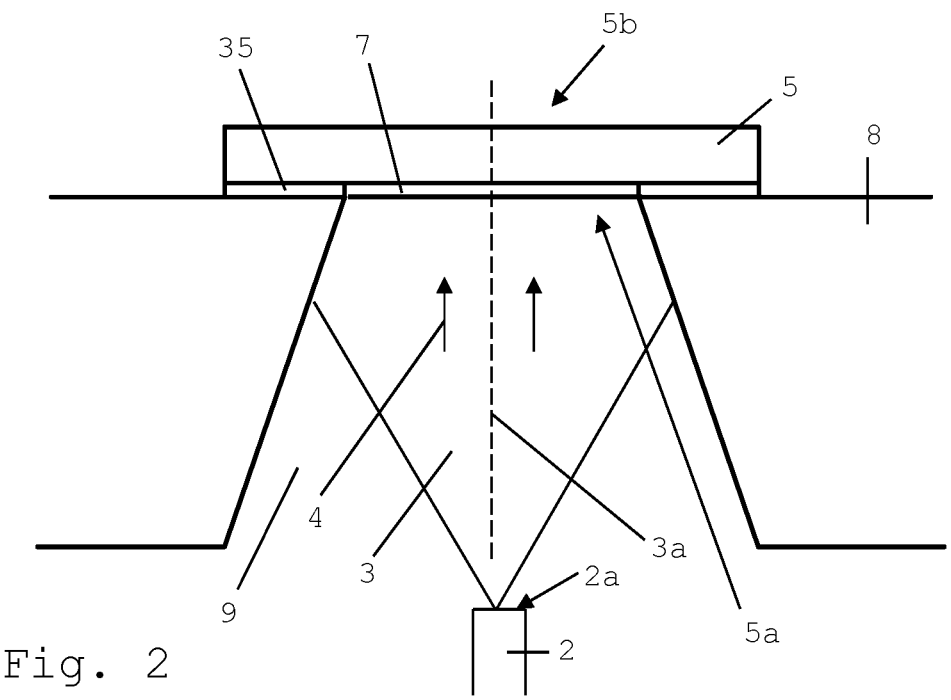
FIG. 2 shows a detail view of the irradiation unit according to FIG. 1, specifically in a sectional plane perpendicular to the plane of the drawing thereof.

FIGS. 1 and 2 show an in principle comparable section through the carrier 8 and the conversion element 5, although in detail the sectional plane according to FIG. 2 is perpendicular to the plane of the drawing in FIG. 1. In these two mutually perpendicular sectional planes, the ray beam 3 has a differently large aperture angle, which results from the use of an edge emitter, cf. also the introduction to the description in detail. Specifically, the aperture angle in the section according to FIG. 1, which section is parallel to the layer stack of the semiconductor chip, is less (referred to as the slow axis) than in the section according to FIG. 2, which section is perpendicular to the layer stack (referred to as the fast axis). In the irradiation unit 1 shown in the present case, although the ray beam 4 is reflected at the inner wall surface 8a of the carrier 8 in the section according to FIG. 7 (fast axis), it is not reflected at the inner wall surface 8a of the carrier 8 in the section according to FIG. 1 (slow axis).

Figure 3:
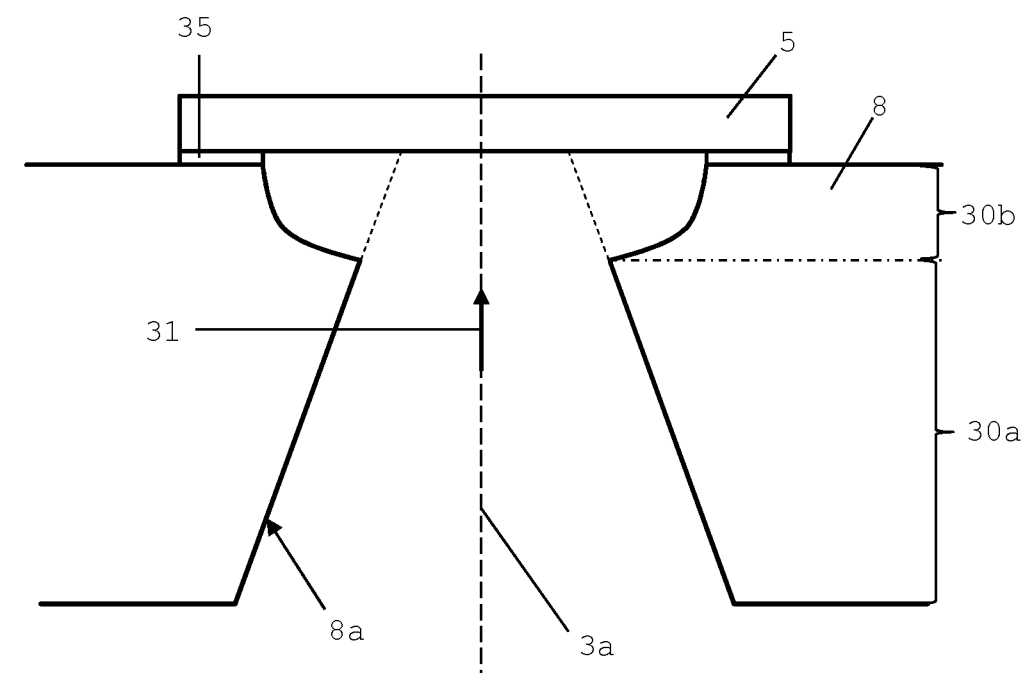
FIG. 3 shows a further possibility for the configuration of an opening used for beam shaping in a carrier, on which a conversion element is mounted, in a detail representation.
Figure 4A:
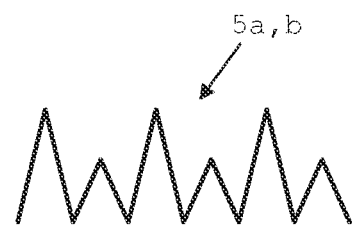
FIG. 4a-d show various possibilities for the configuration of a structured surface for improving the coupling efficiency.
Figure 4B:
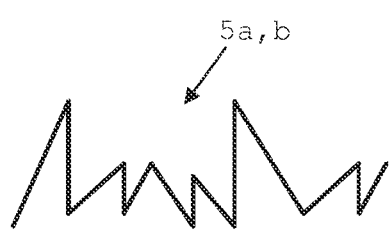
Figure 4C:
Figure 4D:
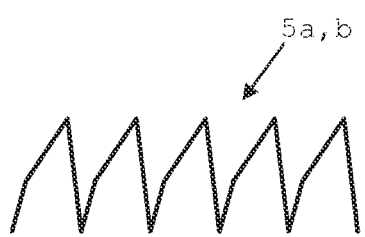
Figure 5A:
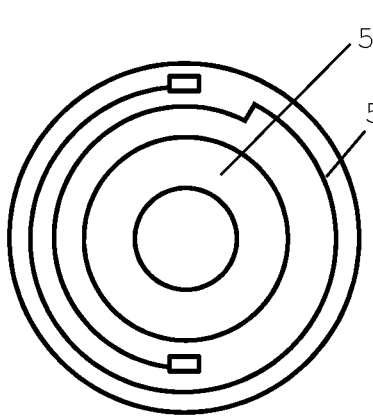
FIG. 5a-i show various possibilities for the arrangement of coupling elements for improving the coupling efficiency on the incidence or emission surface of the conversion element.
Figure 5B:
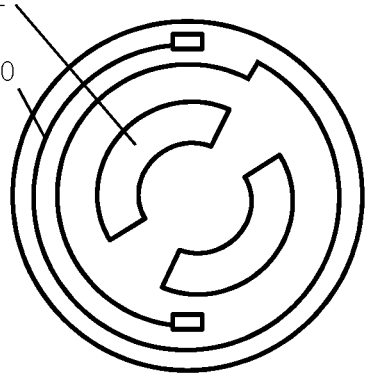
Figure 5C:
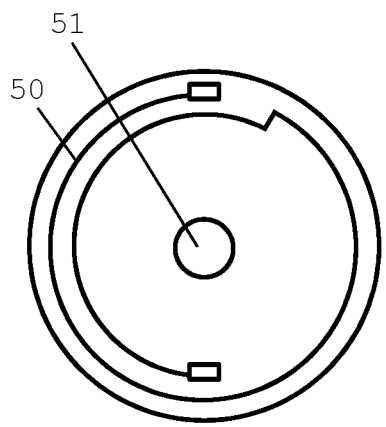
Figure 5D:
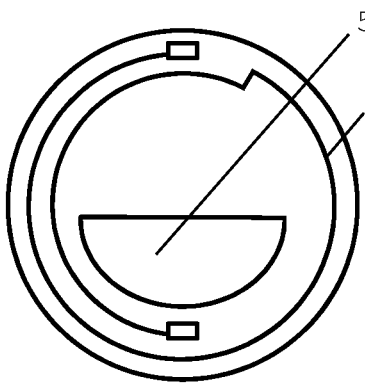
Figure 5E:
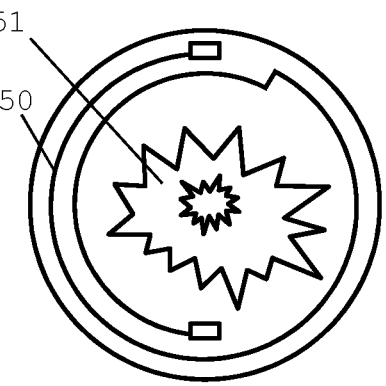
Figure 5F:
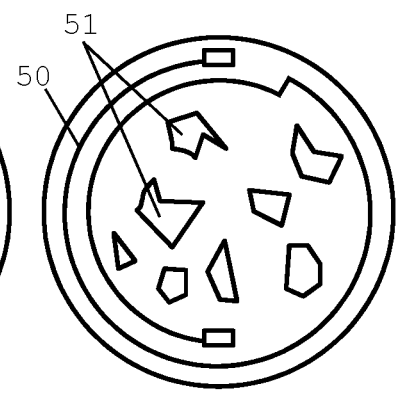
Figure 5G:
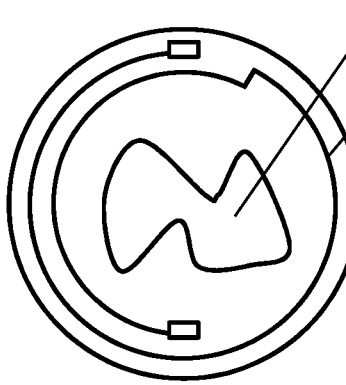
Figure 5H:
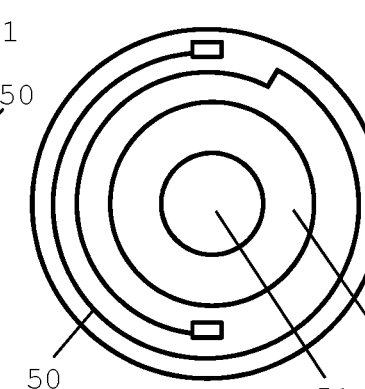
Figure 5I:
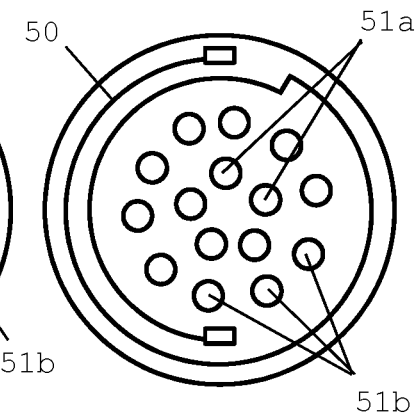

FIG. 3 shows a further possibility for the configuration of the inner wall surface 8a of the carrier 8 in a section comparable to FIG. 2 (for the sake of clarity, the pump radiation source and the ray beam are not represented). In an analogous way to FIG. 2, the inner wall surface 8a tapers, but only in a section 30a. This is followed by a further section 30b, in which the inner wall surface 8a widens again (in general, these specifications relate to a direction 31 pointing toward the incidence surface 5a of the conversion element 5).

In the further section 30b, the inner wall surface 8a forms a trough, and as seen in sectional planes containing a central axis 3a of the ray beam 3 it is circular, i.e. it describes a spherical shape. In general, the inner wall surface 8a widening in sections may be advantageous in terms of efficiency, i.e. radiation unintentionally emitted "backward" (in the direction of the pump radiation source) at the incidence surface 5a is guided again in the direction of the conversion element 5, cf. also the explanations of the introduction to the description.

As may furthermore be seen from FIG. 3, the conversion element 5 is fastened with a material fit on the carrier 8 by means of a solder 35, although sintering of the conversion element 5 is for example possible as an alternative, cf. FIG. 2, for the purpose of illustration, and the introduction to the description. Further details of the mounting will be explained below with reference to FIG. 1.

The pump radiation source 2 (the semiconductor chip) is arranged on a heat sink 10 made of metal. In this case, the pump radiation source 2 is mounted on the heat sink 10 not directly but by means of a submount 11, which may for example be provided consisting of aluminum nitride or silicon carbide. During production, the semiconductor chip is initially adhesively bonded or soldered onto the submount 11, and the submount is subsequently adhesively bonded or soldered onto the heat sink 10.

Furthermore, the carrier 8 is also fastened on the heat sink 10, in the present case by means of a solder 12. During mounting, the conversion element 5 is initially fastened on the carrier 8, preferably soldered thereto (FIG. 3), and the carrier 8 is subsequently soldered to the heat sink 10. The solder 35 between the conversion element 5 and the carrier 8 is in this case selected in such a way that in any event it has a higher melting temperature than the solder 12 in the subsequent soldering step, during the soldering of the heat sink 10 to the carrier 8, cf. the introduction to the description.

The heat sink 10 is fastened on a housing bottom 13, as is known for a TO housing. The entire structure is furthermore enclosed by a cylindrical metal sleeve, which is seated on the housing bottom 13, but this is not represented in the present case for the sake of clarity.

Four connection pins 14 are provided overall, two connection pins 14aa,ab being used for the electrical contacting of the pump radiation source 2, i.e. of the semiconductor chip. To this end, each of the connection pins 14aa,ab is respectively connected by means of a multiplicity of bond wires 15aa, 15ab to the corresponding contact of the semiconductor chip (one on the front side and one via a rear-side connection). The further connection pins 14ba,bb are used for the electrical contacting of a monitoring structure of the conversion element 5, cf. also FIGS. 5 and 7 for the purpose of illustration. The connection pins 14ba,bb to this end respectively pass through the carrier 8, see FIGS. 1 and 7 in combination.

FIGS. 4a-d show a schematic representation of a detail of a structured surface of the conversion element 5, which may be the incidence surface 5a or the emission surface 5b. The surface is configured with an increased roughness, i.e. for example a spike or groove structure is introduced. The structuring may be periodic (FIGS. 4a,d) or randomly distributed, or follow a stochastic profile, cf. in particular FIG. 4c. Structures with the same height (FIG. 4d) or else with different heights (FIGS. 4a-c) are possible. Because of the microscopically increased roughness, i.e. the corrugated surface, Fresnel reflections may for example be reduced, i.e. the coupling efficiency may be increased. More pump radiation 4 may therefore be input-coupled at the incidence surface 5a, and more conversion radiation 6 may be output-coupled at the emission surface 5b.

FIGS. 5a-i respectively show a conversion element 5 in a plan view, the monitoring structure 50 mentioned above initially being visible. It is a circumferential conductive track which may indicate a break or tear or falling-off of the conversion element 5, cf. the introduction to the description in detail. A plan view of the emission surface 5b is respectively shown, FIGS. 5a-i then differing in detail in the arrangement or configuration of the output coupling structures 51. They may be provided in an annular (FIG. 5a) or interrupted (FIG. 5b) or circular (FIG. 5c) form, but any other desired patterns or geometrical shapes are also possible (FIG. 5d-g). The output coupling structures may, in particular, also be subdivided into subregions 51a,b (FIGS. 5h,i) that differ in output coupling properties, i.e. for example in roughness. As an alternative or else in addition to surface structuring, coating with nanoparticles is also possible, explicit reference also being made in this regard to the indications in the introduction to the description. The output coupling structures 51a, 51b may, for example, be configured in such a way that a different angle distribution of the emitted radiation is obtained on account of the thusly increased output coupling efficiency, with the result that a local intensity variation and/or a local spectral composition of the working light may be modified or set, and projected by means of secondary optics (reflector, lens) onto the working surface (road, room).

Figure 6:
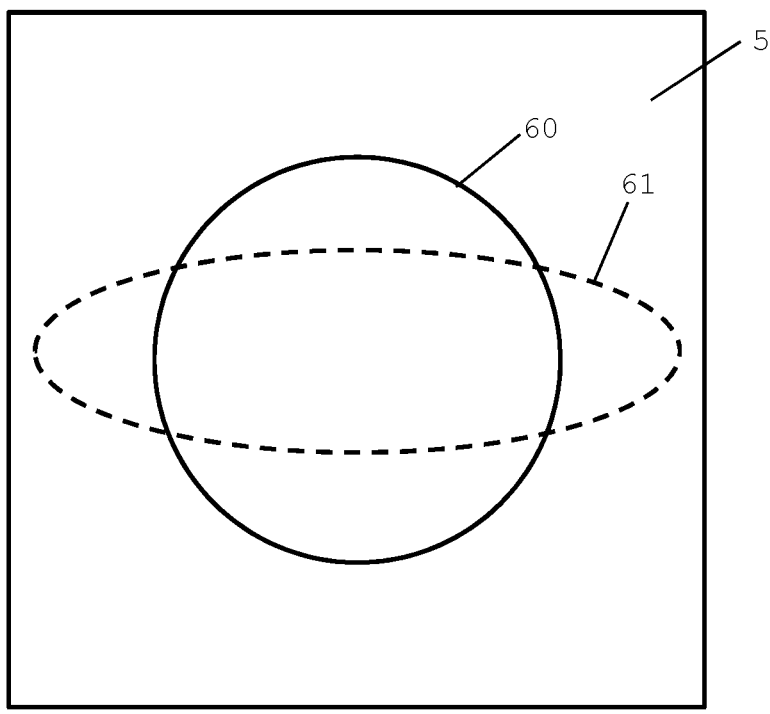
FIG. 6 shows a pump radiation spot produced on the conversion element of an irradiation unit according to the invention in a schematic representation.

FIG. 6 shows a schematic plan view of the conversion element 5 in order to illustrate the adaptation of the pump radiation spot 60 by means of the reflection at the inner wall surface 8 of the carrier 8. For the purpose of illustration, a cross section 61 that the ray beam 4 has upstream of the carrier 8 is also shown. Because of the different divergences on the two axes, this cross section 61 is distorted. With the reflection at the wall surface 8a, specifically in the sectional plane of the fast axis (larger aperture angle), this distortion is at least reduced, and in the ideal case the pump radiation spot is approximately circular.

Figure 7:
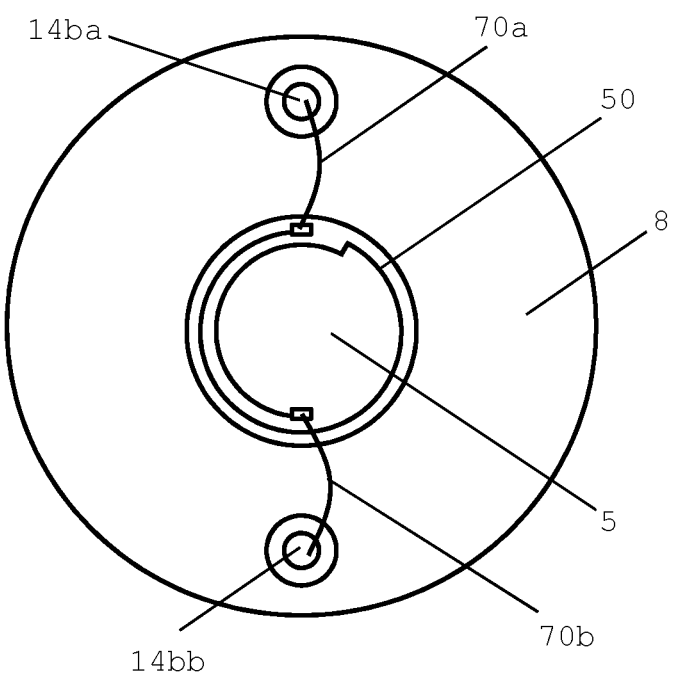
FIG. 7 shows the arrangement according to FIG. 1 in a plan view, looking from the right thereat.

FIG. 7 shows the irradiation unit 1 in a plan view, specifically looking at the carrier 8 from the right in relation to FIG. 1. In this case, on the one hand the conversion element 5, with the monitoring structure 50, mounted on the carrier 8 may be seen. This monitoring structure is connected by means of bond wires 70a,b to the connection pins 14ba,bb, which extend through through-holes in the carrier 8, cf. also FIG. 1 for the purpose of illustration.

Figure 8:
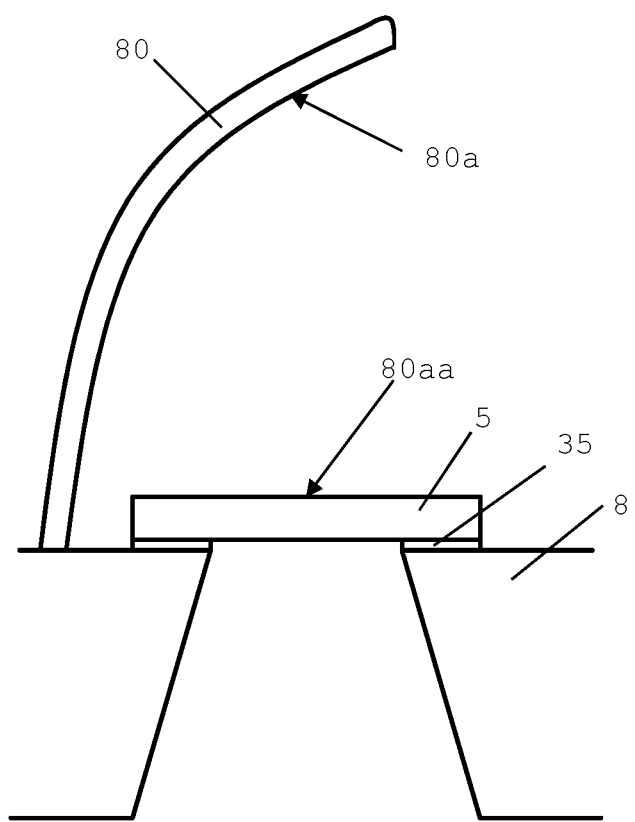
FIG. 8 shows a detail view of an irradiation unit according to the invention having an additional reflector.

FIG. 8 shows a detail of a further irradiation unit 1, a reflector 80 being arranged on the carrier 8. In the present case, it is shown in a section, although in practice it forms, for example, an ellipsoidal or paraboloid reflection surface 80a. At said reflection surface, the conversion radiation 6 emitted at the emission surface 5b of the conversion element 5 (in a mixture with the partially unconverted pump radiation 4) is reflected and shaped. With an ellipsoidal reflection surface 80a, for example, concentration may be achieved, and with a paraboloid reflection surface 80a collimation may be achieved. In both cases, to this end a focal point 80aa of the reflection surface 80a lies in the emission surface 5b of the conversion element 5. The reflector 80 is connected, for example soldered, preferably with a material fit to the carrier 8.

Figure 9:
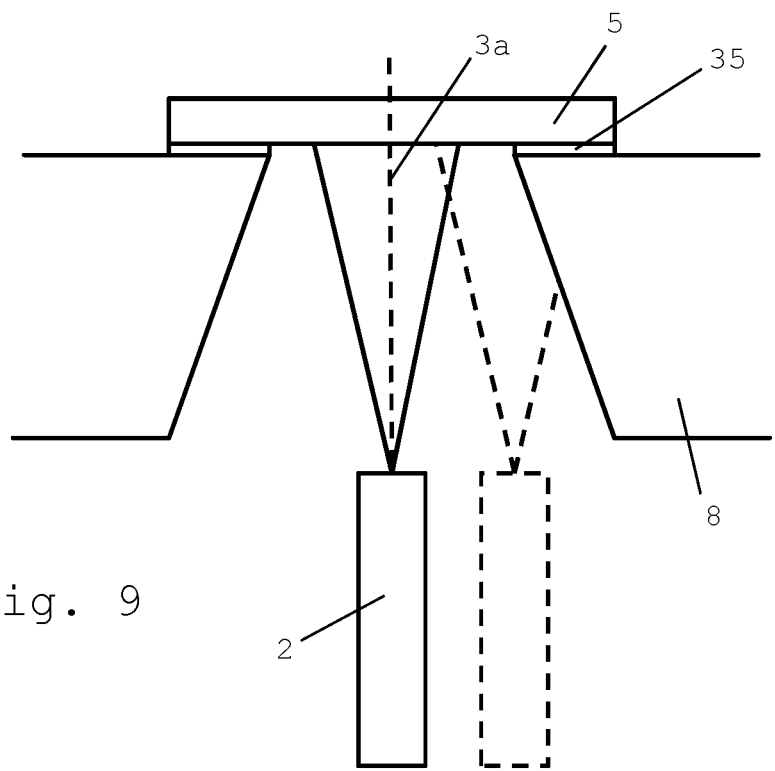
FIG. 9 shows an irradiation unit according to the invention having a pump radiation source mounted so that it can be offset, in a schematic representation.

FIG. 9 shows a detail of an irradiation unit 1 in which the pump radiation source 2 is mounted so that it can be offset, specifically perpendicularly to the central axis 3a of the ray beam 3. To this end, the semiconductor chip may for example be mounted on a piezo element, see the introduction to the description in detail. In any event, there are different offset positions that differ in the arrangement or else shape of the pump radiation spot 16. In the first position, in any event, in this sectional plane all of the pump radiation 4 strikes the incidence surface 5a directly, and in the second offset position (dashed line) the pump radiation 4 is also partially reflected at the inner wall surface 8a.

Figure 10A:
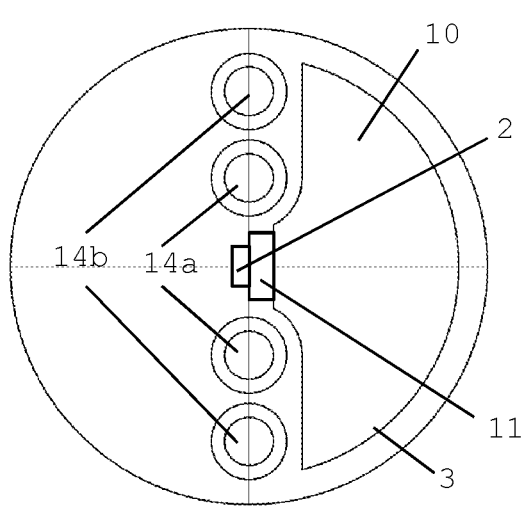
FIG. 10a-d show different possibilities for the arrangement of connection pins of a housing of an irradiation unit according to the invention.
Figure 10B:
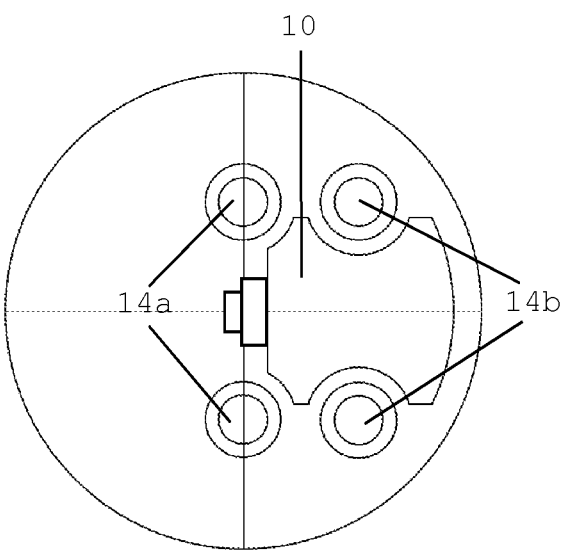
Figure 10C:
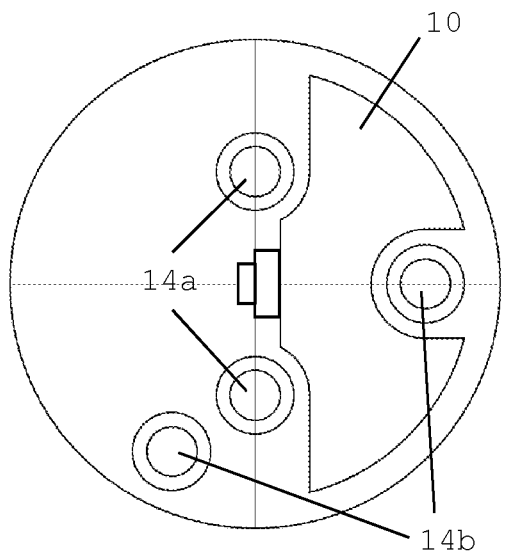
Figure 10D:
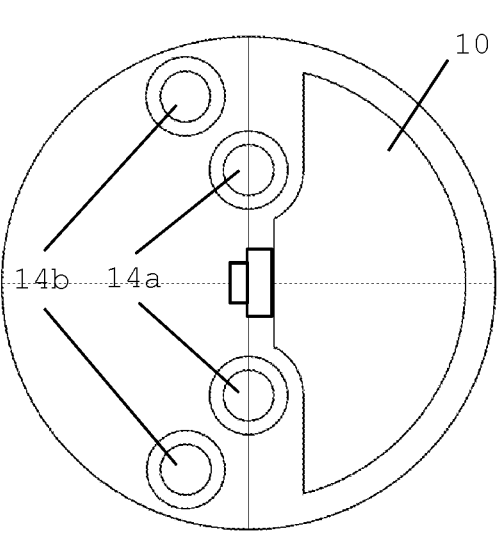

FIGS. 10a-d respectively show the housing bottom 13 in a plan view (looking at it from the right in the arrangement according to FIG. 1). It may be seen from these figures that the connection pins 14 may be arranged differently, for example also depending on the application requirements, i.e. for example the connection possibilities on a circuit board with which a plurality of irradiation units 1 may be combined to form a module. The connection pins 14 may be arranged in a row (FIG. 10a) or in a rectangular (FIG. 10b) or trapezoidal shape (FIG. 10d) or else in any desired other shape (FIG. 10c). The shape of the heat sink 10 may then also be adapted to requirements depending on the arrangement of the connection pins 14.

LIST OF REFERENCE SIGNS

| | |
|---|---|
| irradiation unit | 1 |
| pump radiation source | 2 |
| emission surface | 2a |
| ray beam | 3 |
| central axis | 3a |
| pump radiation | 4 |
| conversion element | 5 |
| incidence surface | 5a |
| emission surface | 5b |
| conversion radiation | 6 |
| mirror (wavelength-dependent) | 7 |
| carrier | 8 |
| inner wall surface | 8a |
| opening | 9 |
| heat sink | 10 |
| submount | 11 |
| solder (heat sink/carrier) | 12 |
| direction (toward the incidence surface) | 31 |
| solder (conversion element/carrier) | 35 |
| housing bottom | 13 |
| connection pins | 14 |
| connection pin | 14aa |
| connection pin | 14ab |
| connection pin | 14ba |
| connection pin | 14bb |
| bond wires | 15 |
| bond wire | 15aa |
| bond wire | 15ab |
| section (in which the inner wall surface tapers) | 30a |
| further section | 30b |
| monitoring structure | 50 |
| output coupling structures | 51 |
| subregions | 51a, b |
| pump radiation spot | 60 |
| cross section | 61 |
| reflector | 80 |
| reflection surface | 80a |
| focal point | 80aa |

The invention claimed is:

1. An irradiation unit, comprising
a pump radiation source in a form of a semiconductor chip for the emission of pump radiation in the form of a ray beam,
a conversion element for at least partial conversion of the pump radiation into conversion radiation, the conversion element comprising a monitoring structure having a conductive track or a conductive track structure, and
a carrier on which the conversion element is arranged,
wherein the carrier is configured with an opening through which the ray beam comprising the pump radiation strikes an incidence surface of the conversion element,
wherein the ray beam comprising the pump radiation travels without deviation and without refraction from an emission surface of the pump radiation source to the carrier,
wherein the opening is laterally bounded by an inner wall surface of the carrier, which tapers in the direction toward the incidence surface at least in a section,
and wherein, during operation, the pump radiation guided in the ray beam, at least part of the time, in any event partially, strikes the inner wall surface of the carrier and is reflected there onto the incidence surface,
wherein the pump radiation source and the conversion element are arranged in a hermetically sealed common housing, and
wherein the carrier is used for ray beam or spot shaping.

2. The irradiation unit as claimed in claim 1, wherein a wavelength-dependent mirror is arranged on the incidence surface of the conversion element, specifically only in the region of the opening of the carrier.

3. The irradiation unit as claimed in claim 1, wherein the pump radiation source is arranged on a heat sink, the heat sink and the carrier being connected to one another with a material fit.

4. The irradiation unit as claimed in claim 1, wherein the conversion element and the carrier are connected to one another with a material fit.

5. The irradiation unit as claimed in claim 1, wherein that inner wall surface of the carrier which bounds the opening of the carrier is mirrored.

6. The irradiation unit as claimed in claim 1, wherein that inner wall surface of the carrier which bounds the opening of the carrier is rotationally symmetrical about a rotation axis.

7. The irradiation unit as claimed in claim 1, wherein the tapering inner wall surface respectively has a rectilinear profile as seen in sectional planes that respectively contain a central axis of the ray beam.

8. The irradiation unit as claimed in claim 1, wherein the tapering inner wall surface encloses, at its end proximal to the incidence surface, a surface which is at least 20% smaller than a surface enclosed by the tapering inner wall surface at its end distal to the incidence surface.

9. The irradiation unit as claimed in claim 1, wherein the section in which the inner wall surface of the carrier tapers is followed in the direction toward the
incidence surface by a further section, in which the inner wall surface of the carrier widens in the direction toward the incidence surface.

10. The irradiation unit as claimed in claim 1, wherein the inner wall surface respectively has a concavely curved profile in the further section in which it widens, as seen in sectional planes containing a central axis of the ray beam.

11. The irradiation unit as claimed in claim 1, wherein the incidence surface of the conversion element is configured at least in regions with a surface structure in order to improve an input coupling efficiency and/or an emission surface of the conversion element is configured at least in regions with a surface structure in order to improve an output coupling efficiency.

12. The irradiation unit as claimed in claim 1, wherein the incidence surface of the conversion element is coated at least in regions with nanoparticles in order to improve an input coupling efficiency and/or an emission surface of the conversion element is coated at least in regions with nanoparticles in order to improve an output coupling efficiency.

13. The irradiation unit as claimed in claim 1, wherein the ray beam comprising the pump radiation has a greater extent along a first principal axis than along a second principal axis upstream of the carrier, as seen in a sectional plane perpendicular to a central axis of the ray beam.

14. The irradiation unit as claimed in claim 1, wherein the pump radiation source is mounted so that it can be offset relative to the carrier, and it is arranged in
different offset positions in different operating modes, in at least one of the operating modes the pump radiation partially striking the inner wall surface (8a) of the carrier and being reflected there onto the incidence surface of the conversion element.

15. The irradiation unit as claimed in claim 1, having a reflector which is assigned to an emission surface of the conversion element in such a way that at least a part of the conversion radiation emitted at the emission surface is reflected at a reflection surface of the reflector.

16. A method for producing an irradiation unit as claimed in claim 1, wherein the conversion element is arranged on the carrier.

17. A use of an irradiation unit as claimed in claim 1 for illumination, in particular for exterior illumination of a motor vehicle, particularly in a front headlamp.

18. The irradiation unit as claimed in claim 1, wherein the pump radiation travels through a gas mixture or a vacuum.

19. The irradiation unit as claimed in claim 3, wherein the heat sink and the carrier are connected to one another by means of a solder, and the conversion element and the carrier are also connected to one another by means of a solder, at least one of the solders being a eutectic solder.

20. The irradiation unit as claimed in claim 3, wherein the pump radiation source is arranged on a heat sink, the heat sink and the carrier being soldered to one another with a material fit.

21. The irradiation unit as claimed in claim 4, wherein the conversion element and the carrier are soldered to one another with a material fit.

22. The irradiation unit as claimed in claim 13, wherein a pump radiation spot produced by the pump radiation on the incidence surface of the conversion element respectively has an extent taken along two axes that are formed by imaging the first and second principal axes onto the incidence surface, any difference between the extents being at least less than in the sectional plane upstream of the carrier.

23. The irradiation unit as claimed in claim 14, wherein the pump radiation source is mounted so that it can be offset at an angle to a central axis of the ray beam comprising the pump radiation.

24. The irradiation unit as claimed in claim 15, wherein the reflection surface (80a) of the reflector is concavely curved at least in regions.

25. The irradiation unit as claimed in claim 15, wherein the reflector is fastened at least indirectly on the carrier.

26. The method as claimed in claim 16, wherein a heat sink and the carrier are connected to one another by a solder in a soldering step, and the conversion element
and the carrier are also connected to one another by a solder in a soldering step, the soldering steps being carried out sequentially and the solder soldered first having a higher melting point during the subsequent soldering step than the solder soldered in the subsequent soldering step.

27. The use as claimed in claim 17, wherein the irradiation unit (1) is assembled together with one or more further irradiation units to form a module.

28. The irradiation unit as claimed in claim 23, wherein the pump radiation source is mounted so that it can be offset perpendicularly to a central axis of the ray beam comprising the pump radiation.

29. The irradiation unit as claimed in claim 24, wherein the reflection surface has a focal point, and this focal point lies in a conversion radiation spot on the emission surface of the conversion element.

30. The irradiation unit as claimed in claim 25, wherein the reflector is connected with a material fit to the carrier.

* * * * *